United States Patent [19]

Ishii

[11] Patent Number: 5,587,851
[45] Date of Patent: Dec. 24, 1996

[54] MAGNETIC HEAD DRIVING DEVICE WITH PRERECORDING ENERGIZATION

[75] Inventor: Mitsuo Ishii, Nabari, Japan

[73] Assignee: Sharp Kabushiki Kaisha, Osaka, Japan

[21] Appl. No.: 570,207

[22] Filed: Dec. 11, 1995

Related U.S. Application Data

[63] Continuation of Ser. No. 275,239, Jul. 15, 1994, abandoned.

[30] Foreign Application Priority Data

Dec. 24, 1991 [JP] Japan ..................... 3-341428

[51] Int. Cl.$^6$ ............................. G11B 5/09; G11B 15/12; G11B 11/00
[52] U.S. Cl. .................. 360/59; 360/61; 360/46; 369/13
[58] Field of Search ................... 360/46, 59, 61, 360/67, 68, 114, 66, 33.1, 62, 65; 369/13, 124

[56] References Cited

U.S. PATENT DOCUMENTS

| | | | |
|---|---|---|---|
| 5,121,369 | 6/1992 | Makansi | 369/13 |
| 5,220,467 | 6/1993 | Zucker | 360/66 |
| 5,229,902 | 7/1993 | Zucker et al. | 360/59 X |
| 5,278,809 | 1/1994 | Ogata | 369/13 |
| 5,278,818 | 1/1994 | Zucker et al. | 360/66 X |
| 5,351,155 | 9/1994 | Ishii | 360/46 |

FOREIGN PATENT DOCUMENTS

| | | |
|---|---|---|
| 0365891 | 5/1990 | European Pat. Off. . |
| 519729 | 12/1992 | European Pat. Off. . |
| 63-94406 | 4/1988 | Japan . |
| 63-244402 | 10/1988 | Japan . |
| 90/05980 | 5/1990 | WIPO . |

OTHER PUBLICATIONS

*Patent Abstract of Japan*, vol. 15, No. 395 (P-1260) 7 Oct. 1991, & JP-A-31 57 839 (Matsushita Electric Ind. Co.).
EPO Search Report.

*Primary Examiner*—Aristotelis Psitos
*Assistant Examiner*—Patrick Wamsley
*Attorney, Agent, or Firm*—Nixon & Vanderhye, P.C.

[57] ABSTRACT

A magnetic head driving device is disclosed. The device includes an inductor for generating a magnetic field, the inductor having a pair of terminals. The device has a first auxiliary coil for storing electromagnetic energy, the first auxiliary coil being connected to one of the terminals of the inductor at a first node, second auxiliary coil for storing electromagnetic energy, the second auxiliary coil being connected to the other terminal of the inductor at a second node, first main switch connected to the first node, second main switch connected to the second node, and control circuit for receiving a first signal indicating generation of a magnetic field by the inductor and a second signal indicating the direction of a magnetic field generated by the inductor and for outputting the second signal for a predetermined period of time in accordance with the first signal to alternately turn on or off the first main switch and the second main switch.

6 Claims, 5 Drawing Sheets

MAGNETIC HEAD DRIVING DEVICE WITH PRERECORDING ENERGIZATION

This is a continuation of application Ser. No. 08/275,239, filed Jul. 15, 1994, now abandoned, which is a divisional of application Ser. No. 07/993,728, filed Dec. 18, 1992, now U.S. Pat. No. 5,351,155.

BACKGROUND OF THE INVENTION

1. Field of the Invention

The present invention relates to a magnetic head driving device for an magneto-optical recording apparatus employing a magnetic field modulation system, and the like.

2. Description of the Related Art

In a magneto-optical recording apparatus, a recording medium is irradiated with laser light to raise the temperature of a film formed on the recording medium to provide for perpendicular magnetization. When the temperature of the film rises, the coercive force thereof decreases to allow the film to be magnetized in the direction of an outer magnetic field presented at that time. When the temperature of the film returns to a normal temperature, this magnetization is retained. Information is recorded on the recording medium by changing the laser light or the outer magnetic field as a function of the information to be recorded.

At present, two systems are typically employed for such a magneto-optical recording apparatus. One is an optical modulation system in which laser light is changed in accordance with recording signals. The other is a magnetic field modulation system in which a magnetic field is changed in accordance with recording signals.

In the optical modulation system, a uniform magnetic field is first applied to the recording medium, which is then irradiated with high-energy laser light modulated in accordance with recording signals. As a result, only a spot on the recording medium irradiated with the modulated laser light is magnetized in the direction of the applied magnetic field. On the other hand, in the magnetic field modulation system, the recording medium is first irradiated with uniform high-energy laser light. Then, a magnetic field modulated in accordance with recording signals is applied to a respective spot on the recording medium. As a result, the spot on the recording medium is magnetized in the direction of the applied modulated magnetic field.

In the optical modulation system, when an area on the recording medium where information has already been written is rewritten with different information, it is necessary to initialize the area before rewriting. This ultimately results in a lowering of the access speed of the recording apparatus. On the other hand, in the magnetic field modulation system, since all the areas for rewriting on the recording medium irradiated uniformly with laser light are magnetized in the direction of the magnetic field in accordance with the recording signals, it is possible to directly rewrite new information over the already-written information on the recording medium, without resulting in the lowering of the access speed of the recording apparatus. Accordingly at present, in consideration of the desired increased access speed, the magnetic field modulation system has been more widely employed for the recording apparatus.

In the magnetic field modulation system, it is necessary to reverse or change the magnetic field at high speed in accordance with the recording signals. To achieve this, in a conventional recording apparatus employing this type of system, a magnetic head is positioned closer to the recording medium to minimize the inductance of a head coil in a driver thereof. At the same time, as disclosed in Japanese Laid-Open Patent Publication No. 63-94406, the magnetic head driving device for driving the magnetic head is provided with an auxiliary coil having an inductance sufficiently larger than that of the head coil, thereby assisting the reversal of the magnetic field generated from the head coil.

FIG. 7 shows the above-described conventional magnetic head driving device. The magnetic head driving device includes a first current path 31 and s second current path 32. When a recording signal S is supplied to the magnetic head driving device, main switches 33 and 34 for the first current path 31 and the second current path 32, respectively, are alternately turned ON/OFF in accordance with The recording signal S. When the main switch 33 of the first current path 31 is ON (i.e., closed), a recording current $I_x$ flows into a head coil 39 from a current resistor $R_{12}$ and an auxiliary coil 36. On the other hand, when the main switch 34 of the second current path 32 is ON, a recording current $I_x$ flows into the head coil 39 in the reverse direction from a current source 37 of the first current path 31 through a resistor R11 and an auxiliary coil 35. As a result, the head coil 39 generates a magnetic field in accordance with the recording signal S.

In addition, when the main switch 33 of the first current path 31 is ON, a current $I_{L1}$ flows from the current source 37 of the first current path 31 through the resistor $R_{11}$ into the auxiliary coil 35. Similarly, when the main switch 34 of the second current path 32 is ON, a current $I_{L2}$ flows from the current source 38 of the second current path 32 through the resistor $R_{12}$ into the auxiliary coil 36. This means that one of the auxiliary coils 35 and 36 is energized with electromagnetic energy by the respective current $I_{L1}$ or $I_{L2}$ while the other of the auxiliary coils 35 or 36 provides the recording current $I_x$ into the head coil 39. Thus, when the recording signal S is changed to alter the ON/OFF state of the main switches 33 and 34, a current immediately flows into the head coil 39 from either one of the auxiliary coils 35 and 36 energized with electromagnetic energy by the current $I_{L1}$ or $I_{L2}$ since the head coil 39 has 9 smaller inductance than the auxiliary coils 35 and 36. As a result, the recording current $I_x$ flowing into the head coil 39 can reverse at high speed.

However, the above-described magnetic head driving device has a disadvantage of power inefficiency, i.e., wasting power. When the main switch 33 of the first current path 31 is ON, the current $I_{L1}$ continues to flow only for the purpose of storing electromagnetic energy in the auxiliary coil 35 of the same current path. This also occurs in the second current path 32 for the case when the main switch 34 is ON. To minimize this wasteful power consumption, Japenese Laid-Open Patent Publication No. 63-244402 discloses a magnetic head driving device as shown in FIG. 8. The magnetic head driving device in FIG. 8 includes auxiliary switches 41 and 42 for the auxiliary coils 35 and 36, respectively. The auxiliary switch 41 is turned ON just before the main switch 34 of the second current path 32 is turned The auxiliary switch 41 is then kept ON until the main switch 34 is turned OFF (i.e., opened). On The other hand, the auxiliary switch 42 is turned ON Just before the main switch 33 of the first current path 31 is turned ON, and is kept ON until the main switch 33 is turned OFF.

In a magnetic head driving device such as shown in FIG. 8, when the main switch 33 of the first current path 31 is turned ON, at first only the auxiliary switch 42 of the second current path 32 is ON while the auxiliary switch 41 of the first current path 31 is OFF. As a result, the current $I_{L1}$ does not flow into the auxiliary coil 35. Then, when The recording signal S is reversed, the auxiliary switch 41 is turned ON, and at the same time, since the main switch 33 is still ON, the current $I_{L1}$ starts to flow into the auxiliary coil 35, thus to energize the auxiliary coil 35. After a certain delay time provided by a delay circuit 40, The main switch 33 is turned OFF and the main switch 34 is turned ON. Then, a current from the energized auxiliary coil 35 flows into the head coil 39 to allow the recording current $I_X$ to reverse at high speed.

In this way, the current $I_{L1}$ does not continue to flow throughout the period of time when the main switch 33 is ON, thereby not wasting power. Instead, the current $I_{L1}$ flows only for a predetermined period of time required for energizing the auxiliary coil 35. This predetermined period is set by adjusting the delay time of the delay circuit 40. Thus, the wasteful use of power can be reduced. The above description is also applicable to the second current path 32 when the main switch 34 is switched from ON to OFF.

However, in the magnetic head driving device of FIG. 7, the auxiliary coils 35 and 36 do not have stored electromagnetic energy at the start of recording. Since the auxiliary coils 35 and 36 have an inductance larger than that of the head coil 39, a longer time is required until the recording current $I_X$ of the head coil 39 reaches a sufficiently high level. More specifically, when the main switch 33 of the first current path 31 is turned ON at the start of recording, several microseconds to several tens of microseconds are required for the recording current $I_X$ supplied into the head coil 39 from the current source 38 to reach a sufficiently high level. This delay is due to a transient response based on the time constant $\tau$ determined by the resistance of the resistor $R_{12}$ and the inductances of the auxiliary coil 36 and the head coil 39. As a result, information recorded at the start of recording tends to be unstable because the magnetic field from the head coil 39 is insufficient.

Furthermore, the magnetic head driving device of FIG. 8 does not completely solve the problem of wasting power. The currents $I_{L1}$ and $I_{L2}$ flowing into the auxiliary coils 35 and 36, respectively, during the delay time provided by the delay circuit 40 are not effectively used as the recording current $I_X$ flowing into the head coil 39, but instead are wastefully discharged. Moreover, with the increase of the recording rate of the recording medium, the period during which the main stitches 33 and 34 are ON will be shorter. To accommodate this shortened ON period, it is necessary to start the supply of the currents $I_{L1}$ and $I_{L2}$ to energize the auxiliary coils 35 and 36 earlier than when the recording signal S is reversed. As a result, the magnetic head driving device of FIG. 8 will still tend to waste power to substantially the same degree as the magnetic head driving device of FIG. 7.

In view of the abovementioned shortcomings associated with conventional magnetic head driving devices, there is a strong need for a magnetic head driving device in which a head coil thereof can generate a sufficiently high level of magnetic field to effect stable recording even at the start of recording. Moreover, there is a strong need for a magnetic head driving device which does not waste power.

SUMMARY OF THE INVENTION

The magnetic head driving device of the present invention includes an inductor for generating a magnetic field, the inductor having a pair of terminals, first storing means for storing electromagnetic energy, the first storing means being connected to one of the terminals of the inductor at a first node, second storing means for storing electromagnetic energy, the second storing means being connected to the other terminal of the inductor at a second node, first switching means connected to the first node, second switching means connected to the second node, and control means for receiving a first signal indicative of generation of a magnetic field by the inductor and a second signal indicative of the direction of a magnetic field generated by the inductor and for outputting the second signal for a predetermined period of time in accordance with the first signal to alternately turn on or off the first switching means and the second switching means.

According to another particular aspect of the present invention, a magnetic head driving device includes an inductor for generating a magnetic field, the inductor having a pair of terminals, first storing means for storing electromagnetic energy, the first storing means being connected to one of the terminals of the inductor at a first node, second storing means for storing e electromagnetic energy, the second storing means being connected to the other terminal of the inductor at a second node, first switching means connected to the first node, second switching means connected to the second node, and control means for receiving a first signal indicative of the generation of a magnetic field by the inductor for a predetermined period of time and for turning on the first switching means and the second switching means in accordance with the first signal.

According to yet another particular aspect of the present invention, a magnetic head driving device includes an inductor for generating a magnetic field, the inductor having a pair of terminals, first storing means for storing electromagnetic energy, the first storing means being connected to one of the terminals of the inductor at a first node, second storing means for storing e electromagnetic energy, the second storing means being connected to the other terminal of the inductor at a second node, first switching means connected to the first node, second switching means connected to the second node, third switching means connected to a terminal of the first storing means located away from the first node, fourth switching means connected to a terminal of the second storing means located away from the second node, and control means for receiving a signal indicative of the direction of a magnetic field generated by the inductor, for turning on the first switching means and the fourth switching means and for turning off the second switching means and the third switching means when the first switching means and the fourth switching means are turned on or vice versa, in accordance with the signal, wherein the first storing means and the second storing means have a common medium for receiving the electromagnetic energies released therefrom.

According to the magnetic head driving device of the present invention, the control means turns the first and second switching means ON for a predetermined period of time before the start of the recording operation by the magnetic head driving device. This causes a current to flow into the first end second storing means to store electromagnetic energy in the storing means, so that a sufficiently large amount of recording current can flow into the inductor to generate a magnetic field at the start of recording.

During the above idling period, when the potential between the first storing means and the first switching means is different from that between the second storing means and the second switching means, a current also flows into the inductor. Therefore, in the case that a recording medium is affected by a magnetic field generated by the inductor before the start of recording, the driving device should be designed such that the impedance of the first current path determined by the first storing means and other components and that of the second current path are equal. However, in a magneto-optical recording apparatus employing the magnetic field modulation system, for example, in which a recording medium is not affected by a magnetic field generated from the inductor unless it is irradiated with laser light, such a problem is avoided, and the idling operation can be performed by alternately turning the switching means ON/OFF by the control means for the idling operation.

Further, according to another aspect of the magnetic head driving device of the present invention, when the storing means of the first current path and the second current path are supplied with a current, they generate magnetic fluxes in the same direction in the shared magnetic core. Accordingly, when a current flows into one of the storing means, an electromagnetic energy having the same polarity is stored in the common magnetic core, energizing both storing means with electromagnetic energy. When a current flows into one of the storing means and the inductor, but does not flow into the other storing means due to the switching control by the switching means, the latter storing means stores electromagnetic energy therein through the former storing means, Thus, when the ON/OFF is reversed in accordance with the recording signal, the storing means energized with electromagnetic energy can supply the recording current into the inductor in a sufficient amount. In this way, since one of the storing means can be energized when the other storing means is energized, wasteful current flow only for energizing the storing means with electromagnetic energy can be prevented.

Thus, the invention described herein makes possible the advantage of providing a magnetic head driving device in which a head coil thereof can generate a sufficiently high level of magnetic field to effect stable recording at the start of recording, and in which wasteful use of power can be avoided.

This and other advantages of the present invention will become apparent to those skilled in the art upon reading and understanding the following detailed description with reference to the accompanying figures.

DESCRIPTION OF THE PREFERRED EMBODIMENTS

Figure 1:
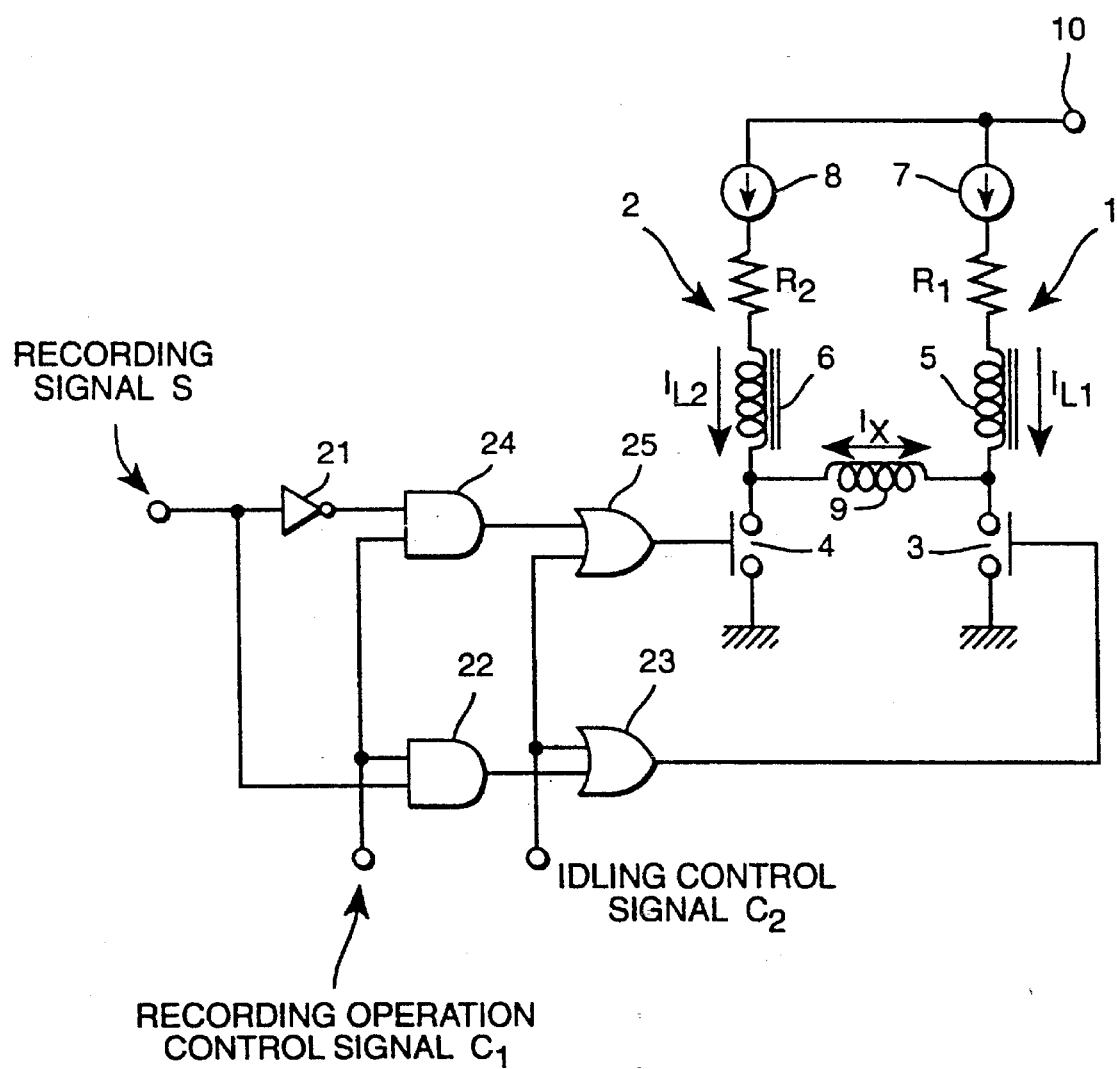
FIG. 1 is a circuit diagram of a magnetic head driving device according to the present invention.

The present invention will be described by way of illustrated examples with reference to the accompanying drawings, wherein like reference numerals are used to refer to like elements.

EXAMPLE 1

FIG. 1 shows a magnetic head driving device according to the present invention used for a general magnetic recording apparatus. The magnetic head driving device includes a first current path 1 and a second current path 2 which are arranged in parallel and are connected to a source terminal 10. The first current path 1 is a circuit having a current source 7, a resistor $R_1$, an auxiliary coil 5, and a main switch 3 connected in series. The second current path 2 is a circuit having a current source 8, a resistor $R_2$, an auxiliary coil 6, and a main switch 4 connected in series. A head coil 9 is connected between the connecting point of the auxiliary coil 5 and the main switch 3 of the first current path 1 and the connecting point of the auxiliary coil 6 and the main switch 4 of the second current path 2.

The head coil 9 is a coil for generating a magnetic field with which information is magnetically recorded on a magnetic medium. The resistors $R_1$ and $R_2$ determine the amount of a recording current $I_x$ flowing into the head coil 9. The auxiliary coils 5 and 6 are used for storing electromagnetic energy therein and have an inductance sufficiently larger than that of the head coil 9. The auxiliary coils 5 and 6 have a resistance as small as less than 1 $\Omega$, which can be disregarded when compared with the resistance of the resistors $R_1$ and $R_2$ which are, for example 10 $\Omega$ or more. The resistances of the resistors $R_1$ and $R_2$ are the same, and the inductances of the auxiliary coils 5 and 6 are the same, so that the impedances of the first current path 1 and the second current path 2 are the same.

The main switches 3 and 4 which are each formed of a MOSFET, for example, are turned ON when control terminals thereof are at a HIGH level. A recording signal S input to the magnetic head driving device of the present invention is coupled to the control terminal of the main switch 3 through an AND gate 22 and an OR gate 23 as shown. At the same time, the recording signal S is also coupled to the control terminal of the main switch 4 through an AND gate 24 and an OR gate 25 after first being inverted by an inverter 21. The AND gates 22 and 24 are also provided with a recording operation control signal $C_1$ as an input to control the magnetic head driving device, essentially selectively masking the recording signal S. When the recording operation control signal $C_1$ is at a LOW level, the respective output signals from the AND gates 22 and 24 will be at a LOW level regardless of he level of the recording signal S, thus turning the main switches 3 and 4 OFF. The level of the recording operation control signal $C_1$ is set HIGH by a controller (not shown) only when a recording operation is performed by the magnetic head driving device.

On the other hand, the OR gates 23 and 25 are supplied with an idling control signs $C_2$ as an input to control the magnetic head driving device. When the idling control signal $C_2$ is at a HIGH level, the respective signal outputs from the OR gates 23 and 25 are always at a HIGH level regardless of the level of the recording signal S, thus turning the main switches 3 and 4 ON. The idling control signal $C_2$ is set HIGH by the controller (not shown) only for a predetermined period of time before the start of the recording operation by the magnetic head driving device.

Figure 2:
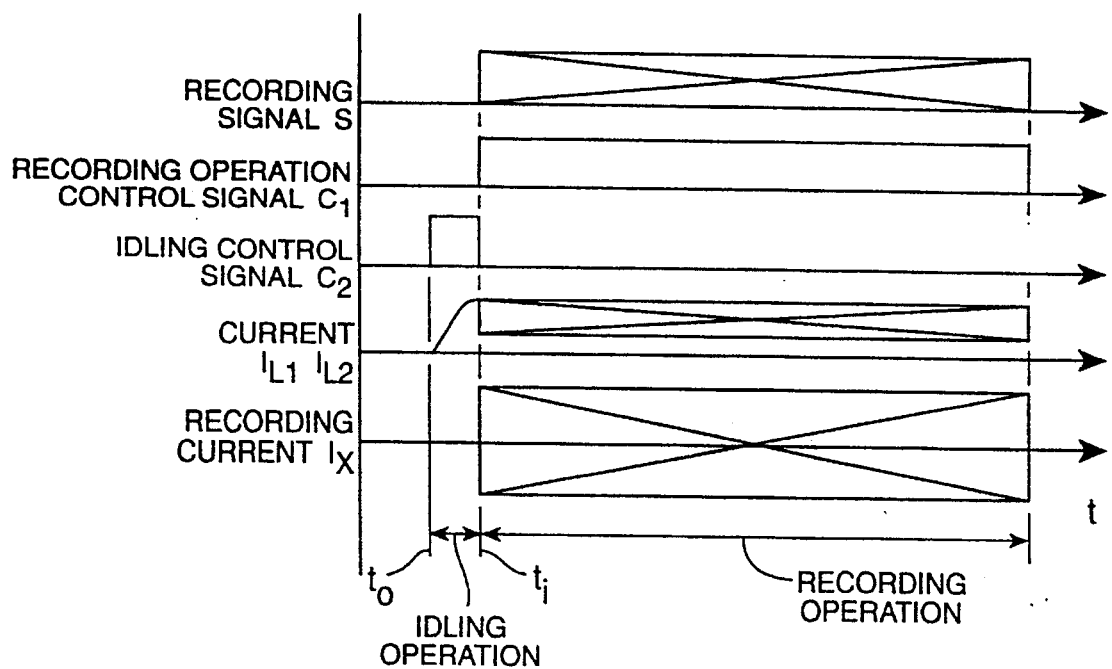
FIG. 2 is a timing chart showing the operation of the magnetic head driving device of FIG. 1.

Next, referring to FIG. 2, the operation of the magnetic head driving device will be described.

Before the start of recording, the controller sets the level of the idling control signal $C_2$ HIGH (e.g., at time $t_0$) to turn both the main switches 3 end 4 ON. This allows the currents $I_{L1}$ and $I_{L2}$ to flow into the auxiliary coils 5 and 6. The currents $I_{L1}$ and $I_{L2}$ start to flow gradually in accordance with the transient response based on the time constant τ determined by the resistances of the resistors $R_1$ and $R_2$ and the inductances of the auxiliary coils 5 and 6. This idling operation lasts for a period of time not less than the time constant, but preferably not much further beyond. During the idling operation, the currents $I_{L1}$ and $I_{L2}$ reach a predetermined level which is high enough to energize the auxiliary coils 5 and 6. Since the impedances of the first current path 1 anti the second current path 2 are the same, the potential difference across the head coil 9 is equal to zero and the recording current $I_X$ does not flow into the head coil 9 during the idling operation. As a result, no magnetic field is generated therefrom and thus there is no influence on a recording medium.

When the idling period terminates ( e. g., time $t_1$), the recording operation starts, whereby the controller sets the level of the idling control signal $C_2$ LOW and that of the recording operation control signal $C_1$ HIGH. In this operational state, the logic level of the recording signal S (i.e., HIGH or LOW) is coupled to the control terminal of the main switch 3 via the AND gate 22 and the OR gate 23 with the level of the signal remaining unchanged. At the same time, the recording signal S is inverted by the inverter 21 and is coupled to the control terminal of the main switch 4. Thus, the main switches 3 and 4 are alternately turned ON/OFF in accordance with the logic level of the recording signal S. Accordingly, when the main switch 3 is ON and the main switch 4 is OFF, for example, the recording current $I_X$ flows from the current source 8 through the resistor $R_2$ and the auxiliary coil 6 into the head coil 9. On the other hand, when the main switch 3 is OFF and the main switch 4 is ON, the recording current $I_X$ flows from the current source 7 through the resistor $R_1$ and the auxiliary coil 5 into the head coil 9 in the reverse direction. A magnetic field in accordance with the recording signal S is thus generated by these reversed flows of the recording current $I_x$.

When the main switch 3 is ON, the current $I_{L1}$ flows from the current source 7 of the first current path 1 through the resistor $R_1$ into the auxiliary coil 5. When the main switch 4 is ON, the current $I_{L2}$ flows from the current source 8 of the second current path 2 through the resistor $R_2$ into the auxiliary coil 6. Accordingly, the auxiliary coils 5 and 6 are energized by the currents $I_{L1}$ and $I_{L2}$ , respectively, while these currents are not supplied to the head coil 9 as the recording current $I_X$. Thus, when the level of the recording signal S is reversed to alter the ON/OFF state of the main switched 3 and 4, a current immediately flows from the respective auxiliary coils 5 and 6 which has stored electromagnetic energy with the current $I_{L1}$ or $I_{L2}$ into the head coil 9 since the head coil 9 has a smaller Inductance than the auxiliary coils 5 and 6. As a result, the recording current $I_X$ flowing into the head coil 9 can be reversed at high speed. According to the present Invention, since the auxiliary coils 5 and 6 have stored electromagnetic energy during the idling operation before the start of the recording operation, the amount of the recording current $I_X$ flowing in the head coil 9 at the start of recording is sufficient.

As a result, according to the magnetic head driving device of this example, the auxiliary coils 5 and 6 can store electromagnetic energy during the idling operation without affecting the recording medium, regardless of the types of recording media which may be used. Thus, the problem of the insufficient amount of the recording current $I_X$ at the start of recording can be prevented.

EXAMPLE 2

Figure 3:
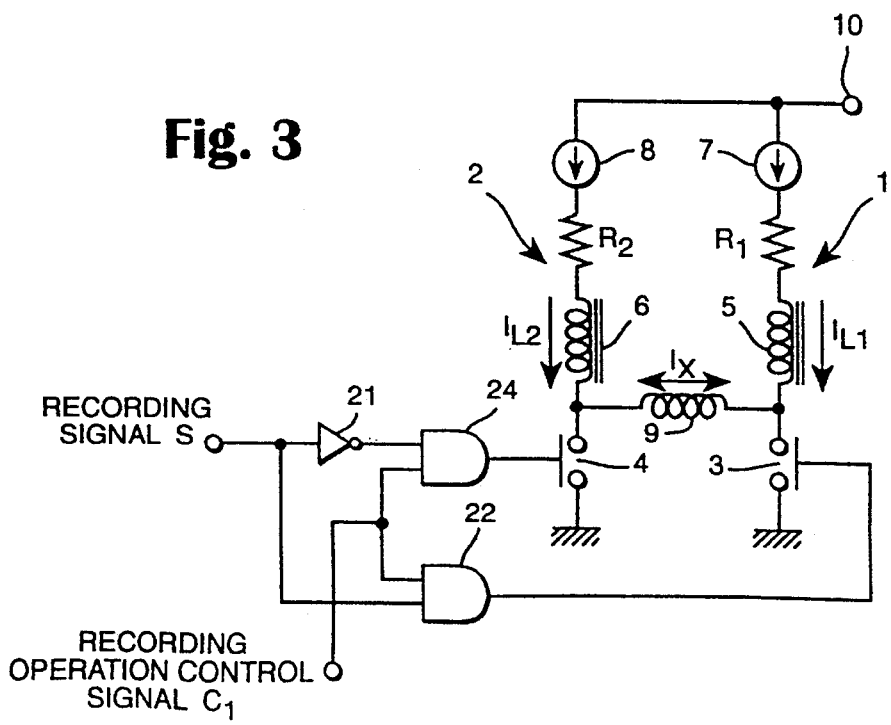
FIG. 3 is a circuit diagram of another magnetic head driving device according to the present invention.

FIG. 3 shows a second example of the magnetic head driving device according to the present invention used for a magneto-optical recording apparatus employing the magnetic field modulation system. The components having similar functions to those in Example 1 are denoted by the same reference numerals as those provided in FIG. 1, and their descriptions are omitted. The configuration of the first current path 1 and the second current path 2 arranged in parallel and connected to the source terminal 10 is the same as that of Example 1 shown in FIG. 1. The circuit for sending the recording signal S to the control terminals of the main switches 3 and 4 is the same as that of Example 1, except that the OR gates 23 and 25 and the idling control signal $C_2$ supplied thereto have been eliminated in this example. Thus, the magnetic head driving device of this example is substantially the same as that of Example 1 when the idling control signal $C_2$ of Example 1 is fixed at a LOW level.

Figure 4:
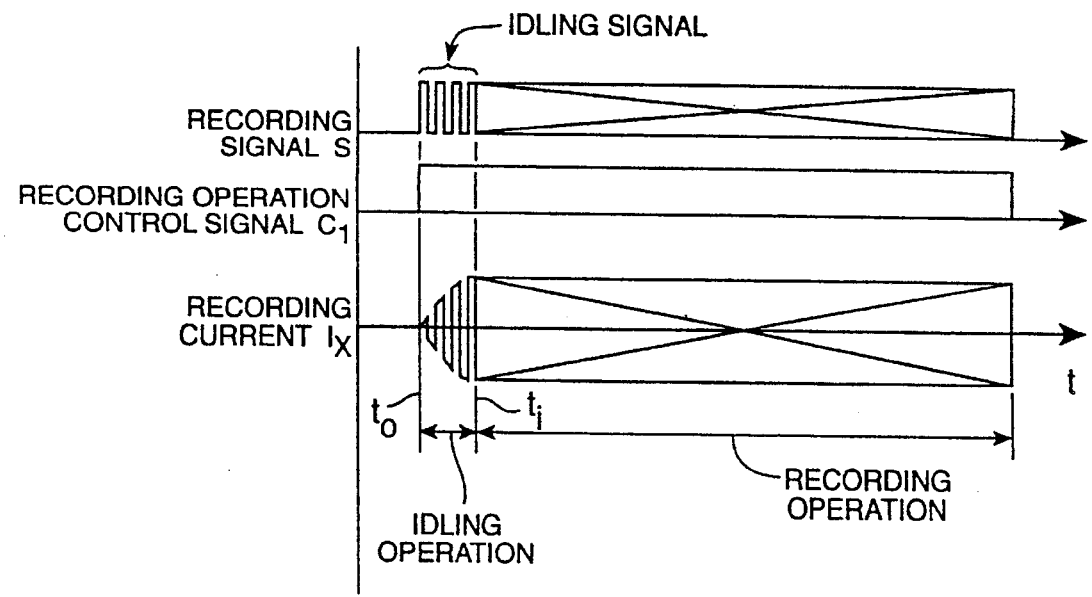
FIG. 4 is a timing chart shoving the operation of the magnetic head driving device of FIG. 3.

Referring to FIG. 4, the operation of the magnetic head driving device of this example will be described.

An idling operation is performed for a predetermined period of time ($t_0$ to $t_1$) before the start of recording. This idling operation includes setting the level of the recording operation control signal $C_1$ HIGH at time $t_0$ using the controller (not shown) before the recording medium is irradiated with laser light, and simultaneously supplying an idling signal as the recording signal S for an idling operation to the magnetic head driving device until time $t_1$. The idling signal for the idling operation is produced providing a HIGH-LOW square wave as the recording signal S. The frequency of the HIGH-LOW square, wave is preferably 3–6 megahertz (MHz). When the idling signal for idling operation is supplied to the magnetic head driving device, the main switches 3 and 4 of the first current path 1 and the second current path 2 are alternately turned ON/OFF repeatedly, so that the absolute value of the recording current $I_X$ flowing into the head coil 9 in the alternating directions through the auxiliary coil 5 or 6 gradually increases. At the same time, the auxiliary coils 5 and 6 sufficiently store electromagnetic energy during the predetermined idling period to allow the recording currant $I_X$ to change direction at high speed. According to experimental tests, it is suitable to set the idling period 1.5 times as large as the time constant τ described in Example 1. During this idling operation, a magnetic field is generated by the recording current $I_X$ flowing into the head coil 9. However, the magneto-optical recording medium will not be affected by the magnetic field unless it is irradiated high high-energy laser When the idling period terminates at time $t_1$, the recording operation starts. During the recording operation period a specified area on the magneto-optical recording medium corresponding to the location where information is to be recorded is sequentially irradiated with high-energy laser light. Simultaneously, the recording signal S is supplied to the magnetic head driving device with the recording operation control signal $C_1$ kept at a HIGH level. As described in Example 1, the main switches 3 and 4 are alternately turned ON/OFF in accordance with the recording signal S, allowing the recording current $I_X$ to flow into the head coil 9 in the alternating directions, thus generating a magnetic field. The area on the recording medium irradiated with laser light is sequentially magnetized in accordance with the magnetic field generated at that time to effect recording. Since the auxiliary coils 5 and 6 have stored electromagnetic energy during the idling operation, the amount of the recording current $I_X$ is, sufficiently large at the start of recording to allow high-speed current reversal.

As a result, according to the magnetic head driving device of this example, the problem of insufficient flow of the recording current $I_X$ at the start of recording can be prevented without the use of the idling control signal $C_2$ as in Example 1, although a longer time is required for the idling operation than in Example 1.

EXAMPLE 3

Figure 5:
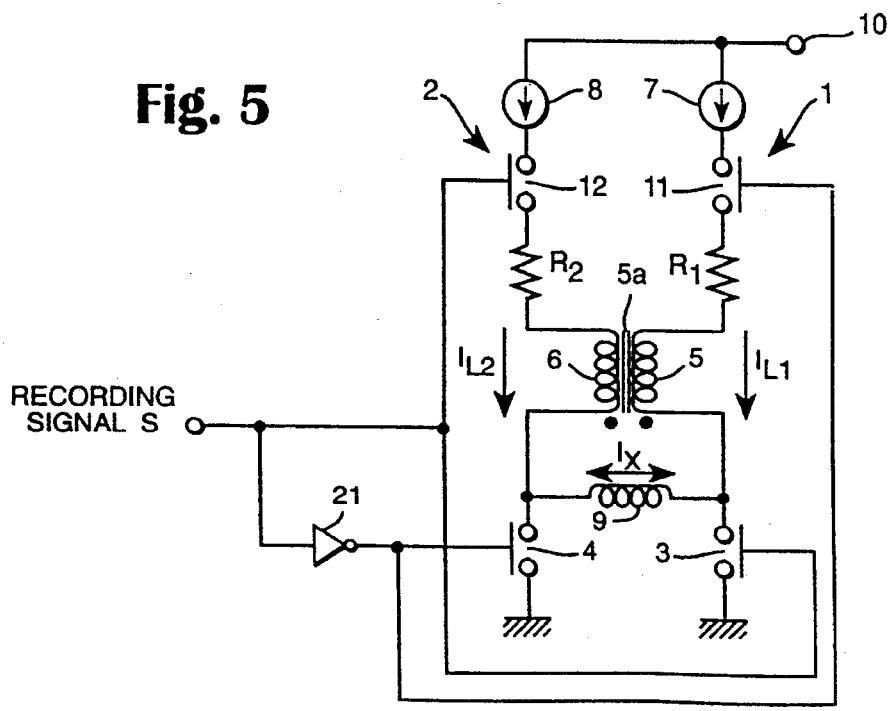
FIG. 5 is a circuit diagram of yet another magnetic head driving device according to the present invention.

FIG. 5 shows a third example of the magnetic head driving device according to the present invention. The components having similar functions to those in Example 1 are denoted by the same reference numerals as those in FIG. 1, and their descriptions are omitted. The configuration of the first current path 1 and the second current path 2 arranged in parallel and connected to the source terminal 10 is substantially the same as that of Example 1 shown in FIG. 1. The differences are that auxiliary switches 11 and 12 having a structure similar to that of the switches 3 and 4 are connected between the current source 7 and the resistor $R_1$ and between the current source 8 and the resistor $R_2$, respectively and that the auxiliary coils 5 and 6 share a single magnetic core 5a and are wound so that magnetic fluxes generated by the currents $I_{L1}$ and $I_{L2}$ are in the same direction in the magnetic core 5a with polarities as indicated. The circuit for sending the recording signal S to the control terminals of the main switches 3 and 4 is substantially same as that of Example 1, except that the recording signal S sent to the control terminal of the main switch 3 is also supplied to the control terminal of the auxiliary switch 12, and likewise the recording signal S sent to the control terminal of the main switch 4 is also sent to the control terminal of the auxiliary switch 11.

Figure 6:
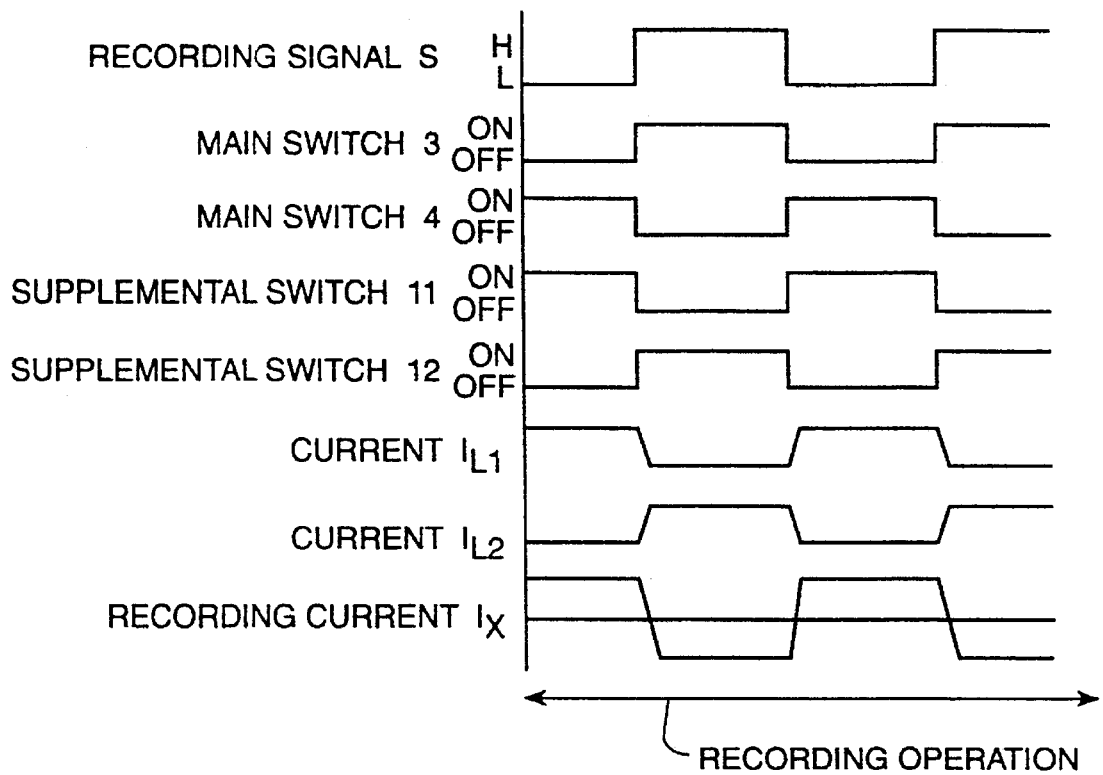
FIG. 6 is a timing chart showing the operation of the magnetic head driving device of FIG. 5.

Referring to FIG. 6, the operation of the magnetic head driving device will be described.

During the recording operation, when the recording signal S is in HIGH level, the main switch 3 of the first current path 1 and the auxiliary switch 12 of the second current path 2 are ON, while the main switch 4 of the second current path 2 and the auxiliary switch 11 Of the first current path 1 are OFF. Accordingly, the current $I_{L1}$ does not flow into the auxiliary coil 5 of the first current path 1, but only the current $I_{L2}$ flows into the auxiliary coil 6 of the second current path 2, which As used as the recording current $I_X$ of the head coil 9. On the contrary, when the recording signal S is in LOW level, the main switch 4 and the auxiliary switch 11 are ON, and the main switch 3 and the auxiliary switch 12 are OFF. Accordingly, the current $I_{L2}$ does not flow in the auxiliary coil 6, but only the current $I_{L1}$ flows in the auxiliary coil 5, which flows into the head coil 9 as the recording current $I_X$ in the reverse direction. As a result, a magnetic field in accordance with the recording signal S is generated from the head coil 9 to effect the magnetic recording.

According to the magnetic head driving device of this example, the magnetic core 5a has been energized with electromagnetic energy by the current $I_{L1}$ or $I_{L2}$ which has flown into the auxiliary coil 5 or 6. Therefore, when the recording signal S is reversed from HIGH to LOW, for example, the electromagnetic energy stored in the magnetic core 5a is supplied through the auxiliary coil 5 to the head coil 9 as the recording current $I_X$, although the auxiliary coil 5 itself has not stored electromagnetic energy with the current $I_{L1}$ : Likewise, when the recording signal 8 is reversed from LOW to HIGH , the electromagnetic energy stored in the magnetic core 5a is supplied through the auxiliary coil 6 to the head coil 9 to flow thereinto in the reverse direction. Accordingly, the recording current $I_X$ can reverse at high speed in accordance with the reverse of the recording signal S. Furthermore, according to this example, since all of the currents $I_{L1}$ and $I_{L2}$ flowing in the auxiliary coils 5 and 6 are used as the recording current $I_X$, no power is wasted.

As a result, according to the magnetic head driving device of this example, the high-speed reverse of the recording current $I_X$ flowing into the head coil 9 can be obtained without wasting the currents $I_{L1}$ and $I_{L2}$ flowing in the auxiliary coils 5 and 6.

Figure 7:
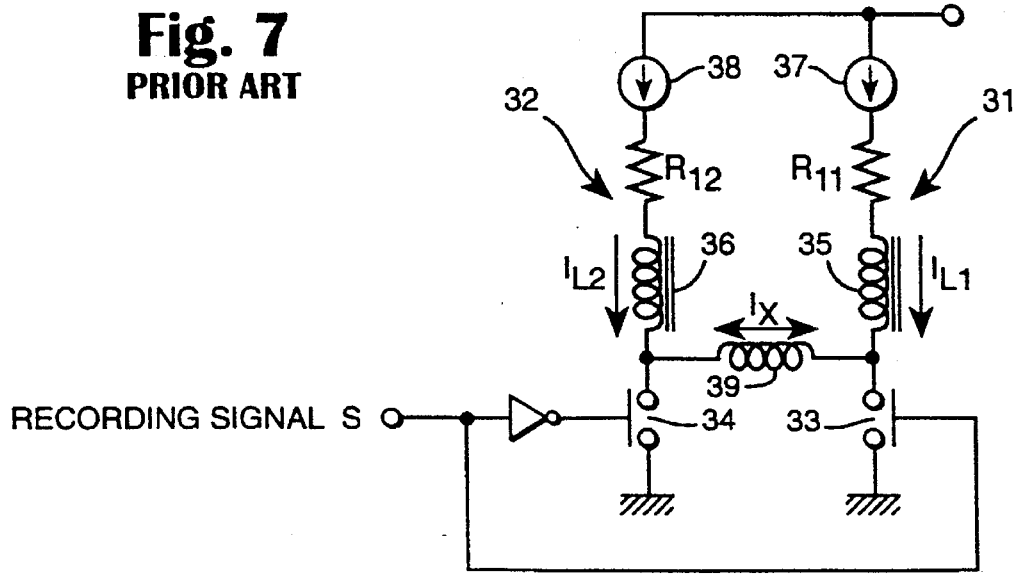
FIG. 7 a circuit diagram of a conventional magnetic head driving device.
Figure 8:
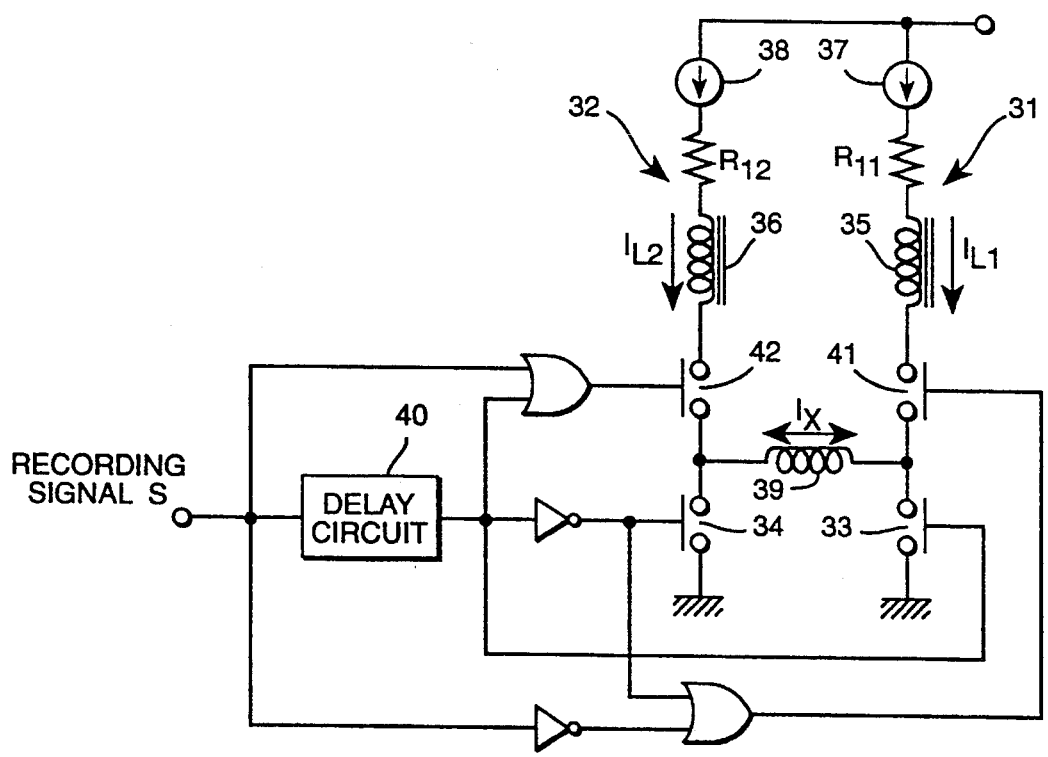
FIG. 8 is a circuit diagram of another conventional magnetic head driving device.

In this example, since the currents $I_{L1}$ and $I_{L2}$ are not supplied to the auxiliary coils 5 and 6 to store electromagnetic energy before the start of recording, the amount of the recording current $I_X$ at the start of recording is insufficient as in the conventional magnetic head driving device shown in FIG. 7. However, this problem is avoided according to the present invention by combining this example with the circuit of Example 1 or 2 for effecting the idling operation before the start of recording.

The magnetic head driving device of the present invention is applicable not only to a magneto-optical recording apparatus employing the magnetic field modulation system, but also to a General magnetic recording apparatus in which information is magnetically recorded on a recording medium by changing an outer magnetic field. This includes a recording section of a magnetic recording and reproducing apparatus.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A magnetic head driving device, comprising:

an inductor for generating a magnetic field, said inductor having a pair of terminals;

first storing means for storing electromagnetic energy, said first storing means being connected to one of said terminals of said inductor at a first node;

second storing means for storing electromagnetic energy, said second storing means being connected to the other terminal of said inductor at a second node;

first switching means connected to said first node;

second switching means connected to said second node; and control means for receiving a first signal indicating that it causes the generation of a magnetic field by said inductor, and a second signal reversing the direction of current through said inductor and inverting the magnetic field with each reversal, said control means outputting a third signal during a predetermined period of time to alternately turn on and off said first switching means and said second switching means, the predetermined period of time being before Start of a recording operation, and physical change on magnetic media being precluded during the predetermined period of time.

2. A magnetic head driving device according to claim 1, wherein said control means outputs said third signal in accordance with said first signal, to alternately turn on and off said first switching means and said second switching means after said predetermined period of time.

3. A magnetic head driving device according to claim 2, wherein said control means includes a third switching means, said third switching means outputting said third signal to said first and second switching means in accordance with said first signal and said second signal.

4. A magnetic head driving device according to claim 1, wherein an inductance of the first storing means is larger than an inductance of the inductor and an inductance of the second storing means is larger than an inductance of the inductor.

5. A method of operating a magnetic head driving device of the type utilized to record on a recording medium when the medium is irradiated with light, the magnetic head driving device comprising an inductor for generating a magnetic field, the inductor being connected to first storing means for storing electromagnetic energy and second storing means for storing electromagnetic energy; the first storing means being connected in series with first switching means and the second storing means being connected in series with second switching means; wherein the method comprises:

generating a gradually increasing idling current in the inductor during a predetermined idling period while the recording medium is not irradiated with light, the idling current in the inductor being switched to flow in alternating directions, the predetermined idling period being before start of a recording operation, physical change on magnetic media being precluded during the predetermined idling period; then, after the predetermined idling period, generating a magnetic field in the inductor while the recording medium is irradiated with light, the magnetic field being generated as a result of generation of a recording current in the inductor, the recording current being switched to flow in alternating directions.

6. The method of claim 5, wherein an inductance of the first storing means is larger than an inductance of the inductor and an inductance of the second storing means is larger than an inductance of the inductor.

* * * * *